(12) United States Patent
Nishimoto et al.

(10) Patent No.: US 11,347,371 B2
(45) Date of Patent: May 31, 2022

(54) AUTOMATIC TRANSLATION OF USER INTERFACE ELEMENTS FROM WIREFRAME TOOLS TO PRODUCTION AUGMENTED REALITY FRAMEWORK

(71) Applicant: Unity Technologies ApS, Copenhagen (DK)

(72) Inventors: Tristan Nishimoto, Burnaby (CA); Richel Tong, New Westminster (CA); Julian Halliday, Calgary (CA)

(73) Assignee: Unity Technologies ApS, Copenhagen (DK)

( * ) Notice: Subject to any disclaimer, the term of this patent is extended or adjusted under 35 U.S.C. 154(b) by 0 days.

(21) Appl. No.: 17/104,883

(22) Filed: Nov. 25, 2020

(65) Prior Publication Data

US 2021/0157471 A1 May 27, 2021

Related U.S. Application Data

(60) Provisional application No. 62/939,856, filed on Nov. 25, 2019.

(51) Int. Cl.
*G06F 3/04815* (2022.01)
*G06T 19/20* (2011.01)
*G06T 19/00* (2011.01)
*A63F 13/533* (2014.01)
*G06F 9/451* (2018.01)

(52) U.S. Cl.
CPC ........ *G06F 3/04815* (2013.01); *A63F 13/533* (2014.09); *G06F 9/451* (2018.02); *G06T 19/006* (2013.01); *G06T 19/20* (2013.01); *A63F 2300/308* (2013.01); *G06T 2200/24* (2013.01); *G06T 2210/08* (2013.01)

(58) Field of Classification Search
CPC .... G06F 3/04815; G06F 9/451; A63F 13/533; G06T 19/006; G06T 19/20
See application file for complete search history.

(56) References Cited

U.S. PATENT DOCUMENTS 9,619,104 B2 * 4/2017 Xin ...................... G06K 9/6201
10,339,721 B1 * 7/2019 Dascola .............. G06F 3/04883
(Continued)

*Primary Examiner* — Sarah Lhymn
(74) *Attorney, Agent, or Firm* — Schwegman Lundberg & Woessner, P.A.

(57) ABSTRACT

Systems and methods for generating an extended reality (XR) user interface are disclosed. A two-dimensional data set is imported. The two-dimensional data set defines a two-dimensional user interface design layout. The two-dimensional data set includes a transition data set corresponding to a user interface element included in the design layout. The two-dimensional data set is converted into a three-dimensional data set. The three-dimensional data set defines a three-dimensional user interface design layout corresponding to the two-dimensional design layout. The converting includes identifying three-dimensional art for each of a plurality of phases corresponding to the transition data set. An XR representation of the three-dimensional data set is provided for editing using an editing application associated with one or more XR devices. Based on the editing, the three-dimensional data set is exported as one or more files that are compatible with an XR development environment.

20 Claims, 6 Drawing Sheets

(56) References Cited

U.S. PATENT DOCUMENTS

| | | | |
|---|---|---|---|
| 2006/0044307 A1* | 3/2006 | Song | G06Q 10/06398 345/419 |
| 2006/0290695 A1* | 12/2006 | Salomie | G06T 17/20 345/420 |
| 2008/0212838 A1* | 9/2008 | Frigerio | G06T 7/269 382/107 |
| 2012/0038739 A1* | 2/2012 | Welch | H04N 13/388 348/14.01 |
| 2012/0045091 A1* | 2/2012 | Kaganovich | G06T 7/579 382/103 |
| 2012/0086728 A1* | 4/2012 | McArdle | G06F 3/017 345/633 |
| 2018/0020165 A1* | 1/2018 | Aerts | G06T 13/80 |
| 2018/0143756 A1* | 5/2018 | Mildrew | G06T 19/003 |
| 2018/0144547 A1* | 5/2018 | Shakib | G06T 15/60 |
| 2020/0126309 A1* | 4/2020 | Moroze | G06F 3/011 |

\* cited by examiner

AUTOMATIC TRANSLATION OF USER INTERFACE ELEMENTS FROM WIREFRAME TOOLS TO PRODUCTION AUGMENTED REALITY FRAMEWORK

CROSS-REFERENCE TO RELATED APPLICATIONS

This application claims the benefit of U.S. Provisional Application No. 62/939,856, filed Nov. 25, 2019, entitled "AUTOMATIC TRANSLATION OF USER INTERFACE ELEMENTS FROM WIREFRAME TOOLS TO PRODUCTION AUGMENTED REALITY FRAMEWORK," which is incorporated by reference herein it its entirety.

TECHNICAL FIELD

This disclosure relates to augmented and virtual reality development and, in one specific example, to designing, editing, creating, and rendering augmented and virtual reality objects, such as in-environment user interface elements.

BACKGROUND OF THE INVENTION

AR and VR technologies have become ubiquitous. As a result, there has been significant growth in the numbers of developers and designers rushing to design new AR and VR environments, objects, games, experiences, and other productions. Unfortunately, current methods of creating and working on AR and VR objects are primarily based upon the legacy of three-dimensional games which are the basis of the associated engines now used for creating AR and VR content.

Most notably, use of these environments, particularly for modelling in three dimensions, is somewhat difficult. For example, many designers are not versed in CAD tools or video game engines. But, they have distinct ideas about how best to interact with an AR or VR environment. And, their UX/UI acumen should not be discounted simply because they may not yet be well-versed at using three-dimensional design tools and software.

For one, most designers use a flat screen computer monitor to view a 2-D representation of their often three-dimensional designs to be used in AR or VR. Designers often use design tools, with simplified interfaces, and more to-the-point process workflows to quickly create and iterate on proposed three-dimensional interfaces and other AR and VR objects. The use of these tools is in part because the workflows are familiar to the user and in part because the designer can quickly iterate and reach a desired vision more quickly. However, at present, these tools result merely in wireframes or mockup designs that are then presented to artists and programmers more well-versed in the video game engines typically used for AR and VR content creation. The artists and programmers must then carefully translate the resulting objects into those engines.

Often, those translations leave a great deal to be desired. The artists and programmers have no sense of scale (e.g., how large is this button?) or positioning (e.g., where in the AR/VR environment is this object?) for the objects presented in the mockups or wireframes. In addition, the objects must be re-created, so coloring or textures are often wrong, shadows fall wrong, the objects are not accurately modelled, and as a result, multiple iterations and revisions are required to reach the designer's original request. In addition, further builds of each program may be required before the results of any changes can even be seen. This is time-consuming. All of this process uses designer, artist, and programmer time that would be better spent on more valuable portions of a given project.

BRIEF DESCRIPTION OF THE DRAWINGS

Features and advantages of example embodiments of the present disclosure will become apparent from the following detailed description, taken in combination with the appended drawings, in which.

DETAILED DESCRIPTION

Figure 1A:
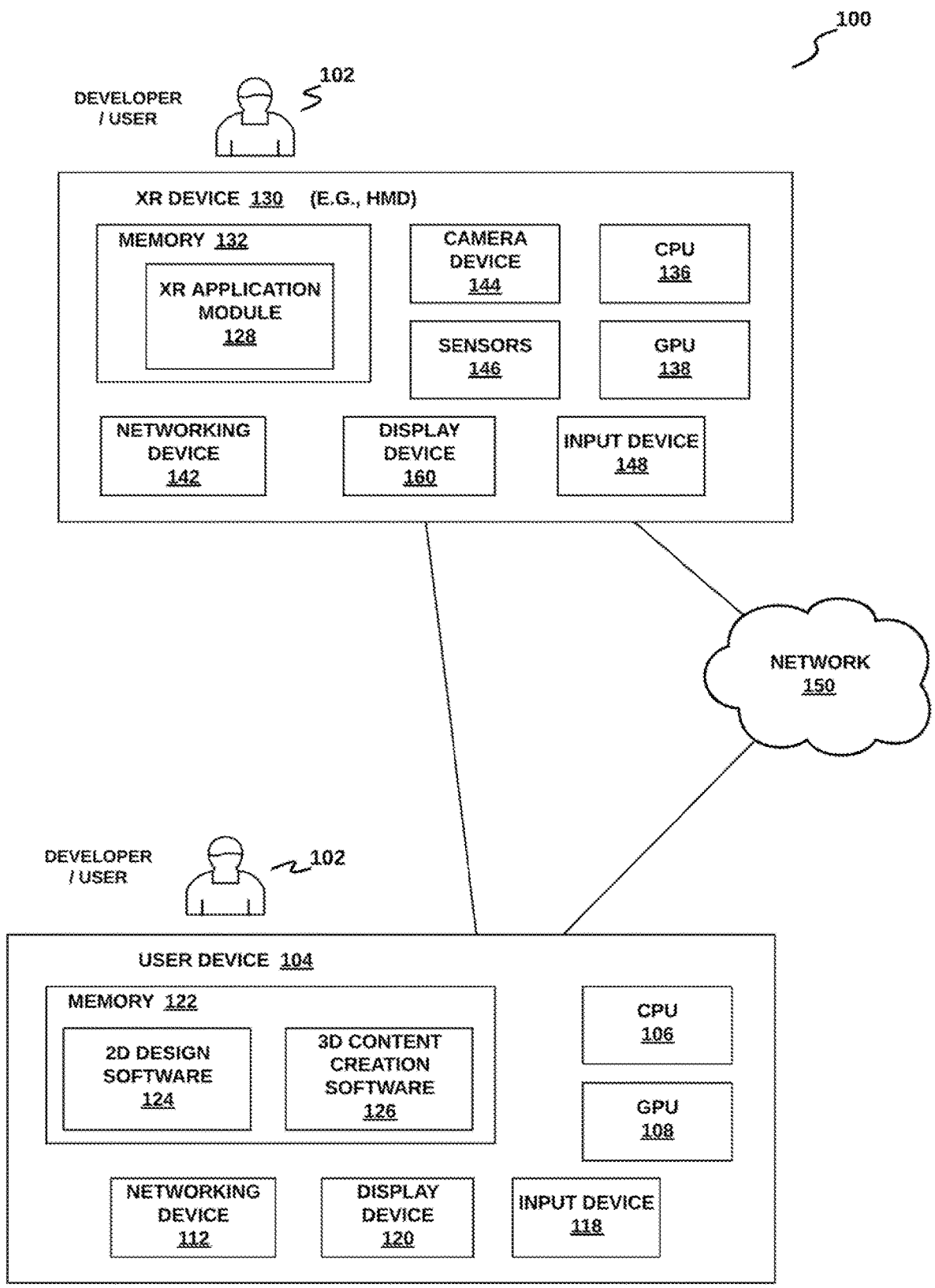
FIG. 1A is a schematic illustrating an extended reality (XR) user interface design system, in accordance with one embodiment.

The description that follows describes example systems, methods, techniques, instruction sequences, and computing machine program products that comprise illustrative embodiments of the disclosure, individually or in combination. In the following description, for the purposes of explanation, numerous specific details are set forth in order to provide an understanding of various embodiments of the inventive subject matter. It will be evident, however, to those skilled in the art, that various embodiments of the inventive subject matter may be practiced without these specific details.

The term 'content' used throughout the description herein should be understood to include all forms of media content items, including images, videos, audio, text, 3D models (e.g., including textures, materials, meshes, and more), animations, vector graphics, and the like.

The term 'game' used throughout the description herein should be understood to include video games and applications that execute and present video games on a device, and applications that execute and present simulations on a device. The term 'game' should also be understood to include programming code (either source code or executable binary code) which is used to create and execute the game on a device.

The term 'environment' used throughout the description herein should be understood to include 2D digital environments (e.g., 2D video game environments, 2D simulation environments, 2D content creation environments, and the like), 3D digital environments (e.g., 3D game environments, 3D simulation environments, 3D content creation environments, virtual reality environments, and the like), and augmented reality environments that include both a digital (e.g., virtual) component and a real-world component.

The term 'game object', used throughout the description herein is understood to include any digital object or digital element within an environment. A game object can represent (e.g., in a corresponding data structure) almost anything within the environment; including 3D models (e.g., characters, weapons, scene elements (e.g., buildings, trees, cars, treasures, and the like)) with 3D model textures, backgrounds (e.g., terrain, sky, and the like), lights, cameras, effects (e.g., sound and visual), animation, and more. The term 'game object' may also be understood to include linked groups of individual game objects. A game object is associated with data that describes properties and behavior for the object.

The terms 'asset', 'game asset', and 'digital asset', used throughout the description herein are understood to include any data that can be used to describe a game object or can be used to describe an aspect of a digital project (e.g., including: a game, a film, a software application). For example, an asset can include data for an image, a 3D model (textures, rigging, and the like), a. group of 3D models (e.g., an entire scene), an audio sound, a video, animation, a 3D mesh and the like. The data describing an asset may be stored within a file, or may be contained within a collection of files, or may be compressed and stored in one file (e.g., a compressed file), or may be stored within a memory. The data describing an asset can be used to instantiate one or more game objects within a game at runtime.

The term 'build' and 'game build' used throughout the description herein should be understood to include a compiled binary code of a game which can be executed on a device, and which, when executed can provide a playable version of the game (e.g., playable by a human or by an artificial intelligence agent).

Throughout the description herein, the term 'mixed reality' (MR) should be understood to include all combined environments in the spectrum between reality and virtual reality (VR) including virtual reality, augmented reality (AR) and augmented virtuality.

The present invention includes apparatuses which perform one or more operations or one or more combinations of operations described herein, including data processing systems which perform these methods and computer readable media which when executed on data processing systems cause the systems to perform these methods, the operations or combinations of operations including non-routine and unconventional operations.

The current disclosure specifies an apparatus and method of using an apparatus to design better AR/VR objects. An AR/VR object is any visual representation or non-visual representation of something in an AR/VR world. It can be the environment itself, a player in a game, shapes, textures, scenery, buildings. For ease of reference sometimes a VR ball or AR setting will be further defined, but for purposes of this disclosure an AR/VR object is any two- or three dimensional object that can be rendered by an AR/VR system.

In certain circumstances a user may use graphics software to access computer files capable of creating or contributing to the creation of an AR/VR environment. Unity® is one such program and others include Unreal® Engine, Google Sketch Up, GDevelop, CRYENGINE, Stencyl, Polycode, Torque 3D, GameMaker: Studio, Urho3D, Verge3D, MonoGame, AutoCAD, SketchUp, Fusion 360, DraftSight, or any program capable of generating or editing image, model, or three-dimensional files.

One advantage of the present disclosure is that it includes a technical solution that enables designers to see and edit their wireframe designs and have them accurately represented in AR or VR. One such wireframe tool is called Sketch, but other, similar software tools exist. The resulting models and wireframes can be directly imported into Unity or other software development or modelling environments. This significantly speeds up and streamlines development of the interfaces and other objects. created by the designer. The disclosure can also automatically import wireframe layouts into video game engine software, eliminating the need for designers to use Unity or other engines (as they can see what they are editing in real time and make changes to it using a separate apparatus) or automatically apply a user's design to the Unity project.

Systems and methods for generating an extended reality (XR) user interface are disclosed. A two-dimensional data set is imported. The two-dimensional data set defines a two-dimensional user interface design layout. The two-dimensional data set including a transition data set corresponding to a user interface element included in the design layout. The two-dimensional data set is converted into a three-dimensional data set. The three-dimensional data set defines a three-dimensional user interface design layout corresponding to the two-dimensional design layout. The converting includes identifying three-dimensional art for each of a plurality of phases corresponding to the transition data set. An XR representation of the three-dimensional data set is provided for editing using an editing application associated with one or more XR devices. Based on the editing, the three-dimensional data set is exported as one or more files that are compatible with an XR development environment.

Turning now to the drawings, systems and methods, including non-routine or unconventional components or operations, or combinations of such components or operations, for designing an XR user interface in accordance with embodiments of the invention are illustrated. In accordance with an embodiment, FIG. 1A shows a schematic illustration of an XR user interface design system 100 that includes a user device 104 and a XR device 130 in networked communication over a network 150 (e.g., a wired or wireless network, WiFi network, cellular network, Local Area Network, the internet, or the like). In accordance with some embodiments, the user device 104 may be a mobile computing device (e.g., such as a smartphone or a tablet computer), or a desktop computer. In accordance with other embodiments, and as shown in FIG. 1C, the user device 104 is a head-mounted display (HMD) device worn by a user 102, such as an augmented reality (AR) or virtual reality (VR) visor (e.g., Google Glass®, HTC Vive®, Microsoft HoloLens®, the PlayStation VR™, Oculus Rift™, and so forth). In accordance with an embodiment, the XR device 130 may be an XR capable device such as an HMD device (e.g., as shown in FIG. 1C) or an XR capable mobile device such as a smartphone.

In accordance with an embodiment, the user device 104 includes one or more central processing units (CPUs) 106 and graphics processing units (GPUs) 108. The processing device 106 is any type of processor, processor assembly comprising multiple processing elements (not shown), having access to a memory 122 to retrieve instructions stored thereon, and execute such instructions. Upon execution of such instructions, the instructions implement the processing device 106 to perform a series of tasks or operations, including one or more non-routine tasks or operations or one or more combinations of tasks and operations, as described herein (e.g., in reference to FIG. 2). The user device 104 may also include a one or more networking devices 112 (e.g., wired or wireless network adapters). for communicating across a network 150.

The user device 104 also includes one or more input devices 118. The input device 118 is any type of input unit such as a mouse, a keyboard, a keypad, pointing device, a touchscreen, a microphone, a camera, a hand-held device (e.g., hand motion tracking device) and the like, for inputting information in the form of a data signal readable by the processing device. The user device 104 further includes one or more display devices 120, such as a touchscreen of a tablet or smartphone, computer monitor, or lenses or visor of a VR or AR HMD, which may be configured to display virtual objects to a user in conjunction with a real world view. The display device 120 is driven or controlled by one or more GPUs 108. The GPU 108 processes aspects of graphical output that assists in speeding up rendering of output through the display device 120.

In accordance with an embodiment, the memory 122 may be configured to store a 2D design software module 124 and a 3D content creation software module 126. The memory 122 can be any type of memory device, such as random access memory, read only or rewritable memory, internal processor caches, and the like. The 2D design software 124 includes instructions, that when executed by the CPU 106 and GPU 108, cause the CPU 106 and GPU 108 to perform operations as described with respect to the method 200 shown in FIG. 2. The 3D content creation software 126 includes instructions, that when executed by the CPU 106 and GPU 108, cause the CPU 106 and GPU 108 to perform operations as described with respect to the method 200 shown in FIG. 2. The memory may also store a game engine (e.g., as part of the 3D content creation software 126) which is executed by the CPU 106 or GPU 108 that communicates with the display device 120 and also with other hardware such as the input/output device(s) 118 to present a 3D digital environment (e.g., a video game environment), a 3D digital content creation environment, and the like on a display device 120. The game engine would typically include one or more modules that provide the following: animation physics for digital objects, collision detection for digital objects, rendering, networking, sound, animation, and the like in order to provide a 3D environment (e.g., 3D game environment, 3D digital content creation environment) for display on the display device 120.

In accordance with an embodiment, the XR device 130 has a CPU 136, GPU 138, networking device 142, display device 160, input device 148 and memory 132 similar to the CPU 106, GPU 108, networking device 112, display device 120, input device 118 and memory 122 of the user device 104. Furthermore, the XR device 130 may include one or more camera devices 144 which may be configured to capture digital video of the real world near a user 102 during operation. The XR device 130 may also include one or more sensors 146, such as a global positioning system (GPS) receiver (e.g., for determining a GPS location of the XR device 130), biometric sensors (e.g., for capturing biometric data of a user 102), motion or position sensors (e.g., for capturing position data of a user 102 or other objects), or an audio microphone (e.g., for capturing sound data). Some sensors 146 may be external to the XR device 130, and may be configured to wirelessly communicate with the XR device 130 (e.g., such as used in the Microsoft Kinect®, Vive Tracker™, MIT's Lidar sensor, or MIT's wireless emotion detector).

In accordance with an embodiment, the memory 132 on the XR device 130 may be configured to store a XR application module 128. The XR application module 128 includes instructions, that when executed by the CPU 146 and GPU 148, cause the CPU 146 and GPU 148 to perform operations as described with respect to the method 200 shown in FIG. 2. The memory 132 may also store a game engine (e.g., as part of the XR application module 128) which is executed by the CPU 146 or GPU 148 that communicates with the display device 160 and also with other hardware such as the input/output device(s) 148 and sensors 146 to present a 3D digital environment (e.g., a VR or AR environment) on the display device 160. The game engine would typically include one or more modules that provide the following: animation physics for digital objects, collision detection for digital objects, rendering, networking, sound, animation, and the like in order to provide a 3D environment (e.g., 3D game environment, 3D digital content creation environment) for display on the display device 120.

Figure 1B:
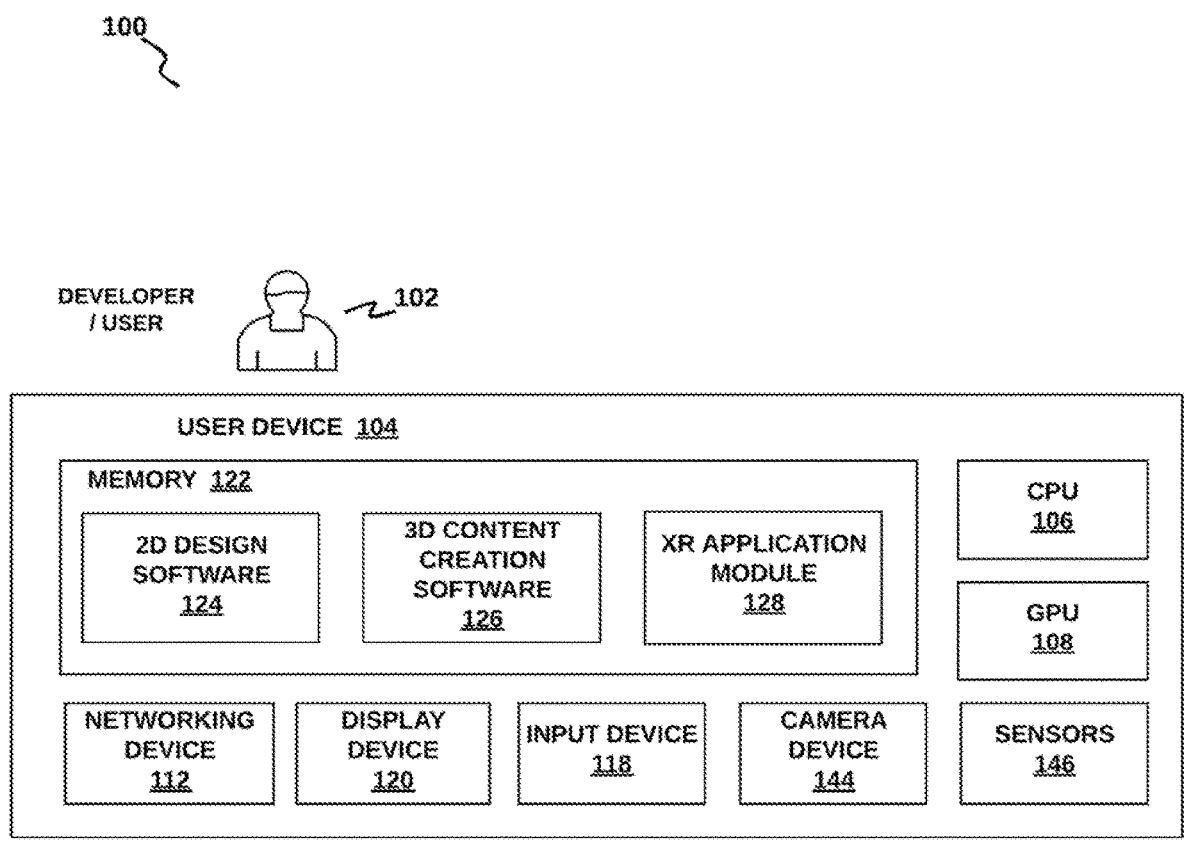
FIG. 1B is a schematic illustrating an XR user interface design system, in accordance with one embodiment.
Figure 1C:
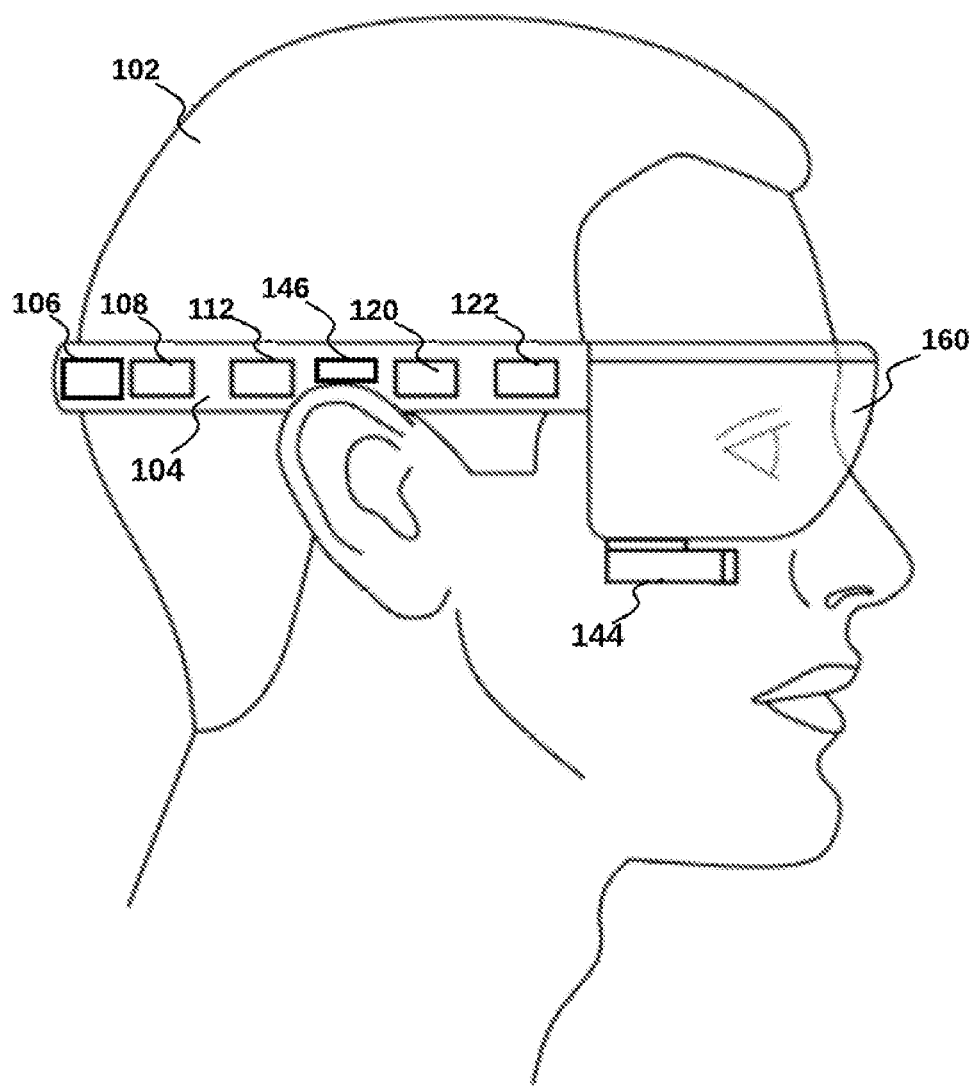
FIG. 1C is a schematic illustrating a head mounted display device (HMD) within an XR user interface design system, in accordance with one embodiment.

In accordance with an embodiment, and as shown in FIG. 1B, the user device 104 and the XR device 130 may be implemented in a single combined user device 104, wherein the memory 122 includes the XR application module 128 in addition to the 2D design software module 124 and the 3D content creation software 126.

In accordance with other embodiments, and as shown in FIG. 1C, the user device 104 (or the XR device 130) is a head-mounted display (HMD) device worn by a user 102, such as an augmented reality (AR) or virtual reality (VR) visor (e.g., Google Glass®, HTC Vive®, Microsoft HoloLens®, the PlayStation VR™, Oculus Rift™, and so forth). In the example embodiment, the user 102 (e.g., a human) experiences a VR environment or AR environment while wearing the HMD user device 104. During operation, in the example embodiment, the HMD user device 104 (or XR device 130) is mounted on a head of the wearer 102, and over both eyes of the wearer 102, as shown in FIG. 1C. The wearer 102 may be presented with a virtual environment which may be viewed and interacted with via the HMD 104 (or XR device 130) and handhelds as described herein (handhelds described below). The HMD user device 104 (or XR device 130) includes a transparent or semi-transparent visor (or "lens" or "lenses") 160 through which the wearer 102 views their surroundings (also herein referred to as "the real world"). In other embodiments, the HMD user device 104 (or XR device 130) may include an opaque visor 160 (not shown) which may obscure the wearer's 102 view of the real world and on which a complete virtual environment is displayed (e.g., including displaying video from the camera device 144 such as in a pass-through mode).

In accordance with an embodiment, the HMD user device 104 (or XR device 130) shown in FIG. 1C includes components similar to the user device 104 and XR device 130 discussed in relation to FIG. 1A. For example, the HMD user device 104 shown in FIG. 1C includes a display device 120, a networking device 112, a camera device 144, a CPU 106, a GPU 108, a memory 122, sensors 146, and one or more input devices 118 (input devices not explicitly shown in FIG. 1C). In the example embodiment, the display device 120 may render graphics (e.g., virtual objects) onto the visor 160. As such, the visor 160 acts as a "screen" or surface on which the output of the display device 120 appears, and through which the wearer 102 experiences virtual content. The display device 120 may be driven or controlled by one or more graphical processing units (GPUs) 108. In accordance with some embodiments, the display device 120 may include the visor 160.

In accordance with some embodiments, the digital camera device (or just "camera") 144 on the user device 104 (or the XR device 130) is a forward-facing video input device that is oriented so as to capture at least a portion of a field of view (FOV) of the wearer 102. In other words, the camera 144 captures or "sees" an angle of view of the real world based on the orientation of the user device 104 (or XR device 130) (e.g., similar to what the wearer 102 sees in the wearer's 102 FOV when looking through the visor 160). The camera device 144 may be configured to capture real-world digital video around the wearer 102 (e.g., a field of view, a peripheral view, or a 360° view around the wearer 102). In some embodiments, output from the digital camera device 144 may be projected onto the visor 160 (e.g., in opaque visor embodiments), and may also include additional virtual content (e.g., added to the camera output). In some embodiments, the camera device 144 may be a depth camera capable of recording depth information within the surrounding environment. In other embodiments, there may be a depth camera in addition to a non-depth camera on the HMD 104 or XR device 130.

In accordance with some embodiments, the user 102 may hold one or more input devices 118 including hand tracking devices ("handhelds") (not separately shown in FIG. 1A, FIG. 1B or FIG. 1C) (e.g., one in each hand). The handhelds may provide information about an absolute or relative position and orientation of a user's hands and, as such, are capable of capturing hand gesture information. The handhelds may be configured to operate directly with the HMD user device 104 (or XR device 130) (e.g., via wired or wireless communication). In some embodiments, the handhelds may be Oculus Touch™, hand controllers, HTC Vive™ hand trackers, PlayStation VR™ hand controllers, or the like. The handhelds may also include one or more buttons or joysticks built into the handhelds. In other embodiments, the user 102 may wear one or more wearable hand tracking devices (e.g., motion tracking gloves, not shown), such as those made commercially available by Manus VR™ (Netherlands). In still other embodiments, hand motion of the user 102 may be tracked without, or in addition to, the handhelds or wearable hand tracking devices via a hand position sensor (not shown, e.g., using optical methods to track the position and orientation of the user's hands) such as, for example, those made commercially available by Leap Motion™, Inc. (a California corporation). Such hand tracking devices (e.g., handhelds) track the position of one or more of the hands of the user during operation.

In some embodiments, the XR user interface design system 100 and the various associated hardware and software components described herein may provide AR content instead of, or in addition to, VR content (e.g., in a mixed reality (MR) environment). It should be understood that the systems and methods described herein (e.g., specifically with respect to FIG. 2) may be performed with XR content and, as such, the scope of this disclosure covers AR, MR, and VR applications.

Figure 2:
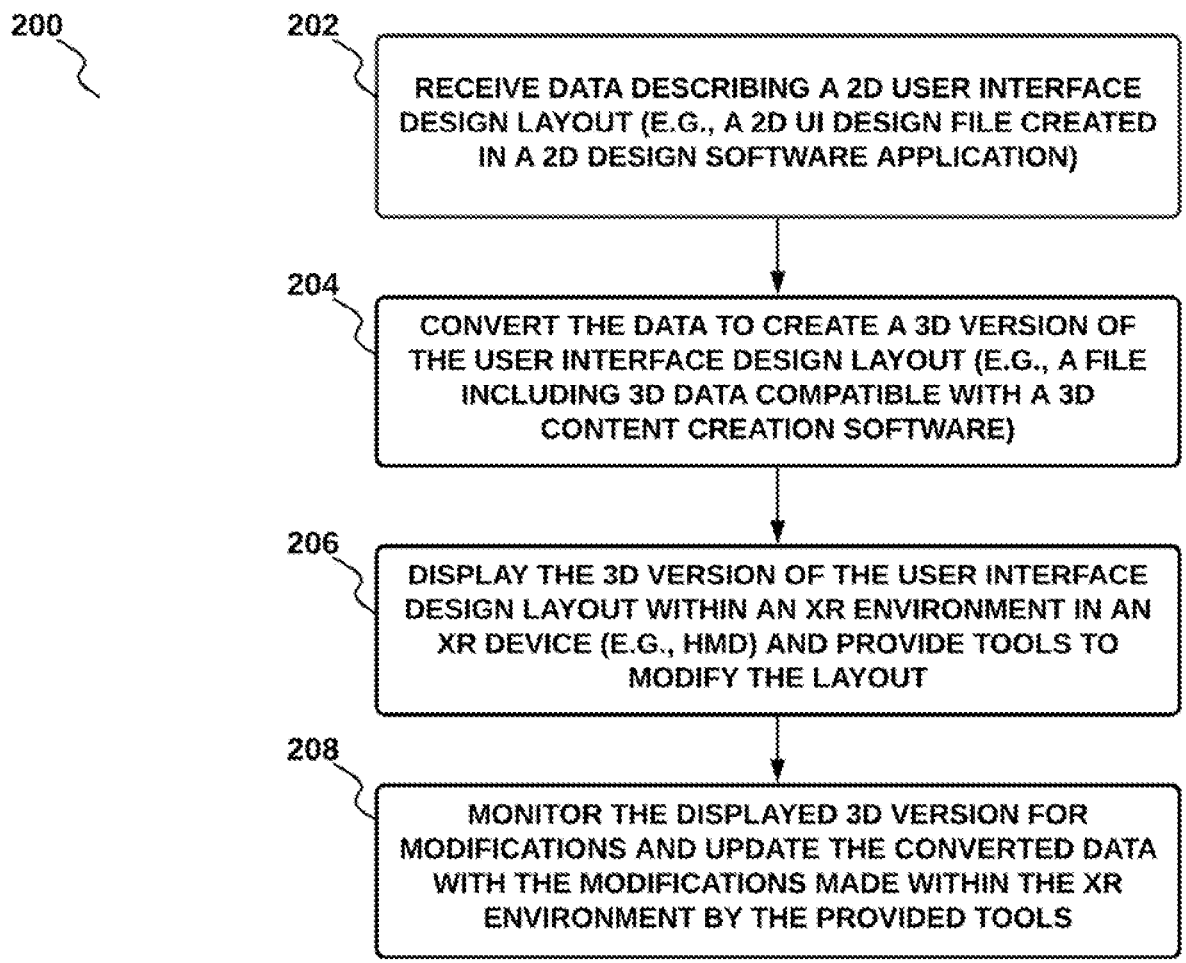
FIG. 2 is a flowchart illustrating a method for designing an XR user interface using a XR user interface design system, in accordance with one embodiment.

In accordance with an embodiment, and shown in FIG. 2, is a flowchart of a method 200 for designing an XR user interface. The method 200 may be used in conjunction with the XR user interface design system 100 as described with respect to FIG. 1A and FIG. 1B.

In various embodiments, some of the method elements shown may be performed concurrently, in a different order than shown, or may be omitted.

In example embodiments, the system may rely upon the use of a number of integrated tools to complete the process of transition from wireframe or design tool to video game engine or other software development environments. At operation 202, a two-dimensional user interface design layout, such as a wireframe layout, is received (e.g., via one of the integrated tools). In example embodiments, the various components of the designs are exported by a first tool (e.g., a plug-in associated with a two-dimensional user interface layout design tool) and then imported into a second tool (e.g., that is associated with the AR/VR environment). In example embodiments, any transitions or desired actions may also be exported (e.g., by the plug-in) and then imported using the second tool or another tool. In this way, transitions between user interface elements may be automatically imported as well. This is useful because when there are two-dimensional mockups of user interfaces, there are often transitions from phase 1 to phase 2, and this is no-less true in AR and VR. For example, a button may be fully extended in phase 1, then, when clicked-upon within the AR/VR environment, the button may transition to a depressed state. The associated graphics may be updated as a result. Then, the button may transition back to phase 1 once the user is no longer depressing it.

At operations 204, the two-dimensional user interface design is converted into a three-dimensional design (e.g. for each user interface element in the design). For example, the art corresponding to each element for that design (e.g., the three dimensional model of the button in both extended and depressed state), as well as the associated transition data corresponding to the art (e.g., such that a button may be shown as depressed when it is depressed), is generated by converting the data that was exported from the mock up or wireframing tool and identifying the corresponding three-dimensional data in the production environment, whatever that may be.

To enable this technological solution, certain workflows may be used. For example, when using a two-dimensional user interface layout design tool, it may be favorable to flatten images in a sketch files grouping. In certain circumstances designers may group their content items to accommodate the parsing of the flow (e.g., the button extended and depressed). In order to keep every icon, element, etc. separate, many groups may be defined. In example embodiments, groups may be dynamically updated, or versions of groups created, that accommodate changes and updates by the user. In example embodiments, if text is part of a file used by parser, the text is flattened into an image. In other embodiments, the text is not flattened. The determining to flatten the text or not may be based on performance data (e.g., rendering speed) versus a measure of quality of the rendered AR or VR object, such as a measurement of the integrity of the object). Additionally, when using certain parsers there may be no instancing of images. If an icon or other text image appears multiple times, it will be exported as multiple images. In other instances, it may be favorable to instance images and other data so it need not be exported multiple times. In example embodiments, instancing of images and other data is used based on a determination that instancing is faster and/or retains the integrity of the finally rendered AR or VR object.

When images and data are loaded, they may often have Anchors and positioning associated with them. This data may be imported incorrectly (e.g., depending on the layout of the mock up software artboards) because some programs are unable to render a 2d image into an AR or VR world very well. Various calculations and processes may be used to solve this problem. For one, if the repository is shared over a network, usage statistics of how designers manipulate the image and objects may be stored and useful data extracted from the usage on how the image should render. For example, say a file of an image is rendered, but always rendered upside down and too far left of a user's workspace in the UI. If, when accessing the file, users usually rotate the image and move it to the middle of a workspace, the system 100 may learn (e.g., through generation and application of a machine-learned model) to begin rendering the object the "proper" way in accordance with the typical behavior of the users of the system.

One benefit of such a system includes the technological solution of a near instant translation of two-dimensional mock-ups to three-dimensional production environment, which leads to a reduction in designer, artist, and engineer time. Also, with this technological solution, the objects are imported perfectly or near-perfectly in their size, shape, textures, orientation and the like within the AR or VR environment. For example, actual images of the associated textures are generated and incorporated. So, there is little to no opportunity to alter the textures. Similarly, actual three-dimensional models are generated that correspond exactly to those in the design tool. Again, there is little to no opportunity for altering them.

Another advantage of the described technical solution is how it dynamically loads content into a device application and memory. New builds are not required every time new content is loaded or edited. Additionally, powerful software such as Unity is often required to alter files. Though altering files itself may not use much computation power, loading and running a major graphics program or development environment such as Unity may. Using this technological solution, content may be altered and manipulated using a relatively light and simple wireframing tool rather than using some more substantial development environment.

In example embodiments, the overall translation environment may be modified to take prefabs generated from a user interface and assets from a transition translator and automatically create asset bundles from them. These asset bundles may then be hosted on a local (e.g., xampp) server. A virtual reality headset and related software such as the Magic Leap app may then download the bundles and have them loaded at runtime. This technological solution is beneficial because it requires no recompilation of the associated software, which merely loads assets saved independently, and shortcuts the transition from changes to the design directly from the designer to the latest build. Changes made in the app may then be uploaded back to a development server. Appropriate formats for uploading to the server may include Json format.

At operation 206, the converted three-dimensional version of the user interface layout is presented within an XR environment for viewing and editing using one or more XR devices. In example embodiments, a user may use a writing implement or controller to select and modify an AR object. The controller can further be used to select UI features that a user may further use to change AR or VR objects. For example, the user can make selections such as color, texture, size, actions, or other features associated with the AR or VR object by selecting them from a UI generated in the AR/VR environment. In other instances, certain gestures may be preprogrammed to be associated with the selection of certain features.

At operation 208, the modifications to the three-dimensional user interface layout are monitored and then used to update the converted three-dimensional data, which, in turn, may be imported into a graphics processing program. Thus, for example, the described technological solution may include dynamically importing changes into a graphics processing program. For example, once a designer has made changes in the XR editing application, those changes can be loaded and applied back into a graphics processing program such as Unity or a similar program. It should be noted that, in example embodiments, although the original files were made using a development environment, such as Unity, their access, manipulation, and rendering may not be done using the same environment or another similar graphics manipulating software. Instead, a more lightweight XR editing tool may be used.

Specifically, files created or edited with the XR editing software are saved to a server located on a network. This server can then be accessed by other computing devices such as a VR/AR headset and particular files downloaded to the computing device. The files are then rendered not in the software environment or graphics editing. software but opened with a separate XR software editing application associated with an AR/VR helmet. Edits made to these files with the UI and software or the AR/VR headset are then saved to the file and put back on the server. In this way the graphics editing software need not be loaded for files to be changed.

Furthermore, prefabs may be programmed either into a program or accessed from a server. The prefabs themselves can then be further edited by the user with the proper selections within the UI. Thus, the user can continuously build and improve upon prefabs, iterating and iterating until they are satisfied with the final AR/VR object.

In example embodiments, changes to the files may be uploaded by the app in the AR/VR headset and downloaded and applied back to the prefab from the server via a custom Inspector function. This function may be either part of the AR/VR UI or a different piece of software entirely. As discussed above with reference to the importation from Sketch to Unity, these changes may only act as guides for the creation of new, proper UI prefabs. In example embodiments, the UnityWebRequest, usually performed in a coroutine, is done in EditorUpdate( ), as coroutines are unavailable on Editor scripts.

In example embodiments, the described technological solution should prove useful in easing a particularly inefficient step in the wireframe or mockup to graphics processor AR/VR workflow. Although the designers would not have to use the software development environment, it may still helpful for someone (dev or otherwise) to load the translation tool files into the software environment and run them through an importer/asset bundler generator.

Another aspect of this technological solution is the ability to take files from different programs, render them in an AR/VR environment, edit the files, upload the files back to a server, and have the files work in other programs. This is because sometimes files are composed of a single file (e.g. a single .png or .jpg) or composed of multiple files within a folder (e.g., a .json with a plethora of object files and image files). In the case of multifile files, the disclosure creates new files to add within directories. When files are sent back to a graphics processing program such as Unity, the old files are used to render a shape within Unity, then the new files are used to instruct the graphics processing program to alter the old files to create an image that looks like what the user was looking at via the AR/VR environment.

An example workflow is discussed below. A designer creates a detailed 2D layout in Sketch, and they export it via a custom plugin for the software. The designer uploads the resultant bundle of files & metadata (their positions, sizes, & hierarchy) to a server, exposing the changes to a separate application, built in Unity & running on an AR headset.

The designer dons the AR headset, and launches the Holographic Design Tool within the AR/VR environment. They select their new exported file as it appears in a list, and the graphics & layout that they had designed in sketch appears in AR space in front of them. They are able to select individual components, or groups of the sketch, and adjust the depths and scales of the graphics. They are also able to replace the graphics with 3D extrusions, or objects from a library, and apply behaviors and animations to each individual graphic, or to groups of graphics.

The designer can then export the modified layout, including behaviors & 3D extrusions as a bundle (back to the asset server), which developers are able to use in a Unity project for traditional development.

While illustrated in the block diagrams as groups of discrete components communicating with each other via distinct data signal connections, it will be understood by those skilled in the art that the various embodiments may be provided by a combination of hardware and software components, with some components being implemented by a given function or operation of a hardware or software system, and many of the data paths illustrated being implemented by data communication within a computer application or operating system. The structure illustrated is thus provided for efficiency of teaching the present various embodiments.

It should be noted that the present disclosure can be carried out as a method, can be embodied in a system, a computer readable medium or an electrical or electro-magnetic signal. The embodiments described above and illustrated in the accompanying drawings are intended to be exemplary only. It will be evident to those skilled in the art that modifications may be made without departing from this disclosure. Such modifications are considered as possible variants and lie within the scope of the disclosure.

Certain embodiments are described herein as including logic or a number of components, modules, or mechanisms. Modules may constitute either software modules (e.g., code embodied on a machine-readable medium or in a transmission signal) or hardware. modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or with any suitable combination thereof. For example, a hardware module may include dedicated circuitry or logic that is permanently configured to perform certain operations. For example, a hardware module may be a special-purpose processor, such as a field-programmable gate array (FPGA) or an Application Specific Integrated Circuit (ASIC). A hardware module may also include programmable logic or circuitry that is temporarily configured by software to perform certain operations. For example, a hardware module may include software encompassed within a general-purpose processor or other programmable processor. Such software may at least temporarily transform the general-purpose processor into a special-purpose processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between. or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, with a particular processor or processors being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the processors, not only residing within a single machine, but deployed across a number of machines. In some example embodiments, the processors or processor-implemented modules may be located in a single geographic location (e.g., within a home environment, an office environment, or a server farm). In other example embodiments, the processors or processor-implemented modules may be distributed across a number of geographic locations.

Figure 3:
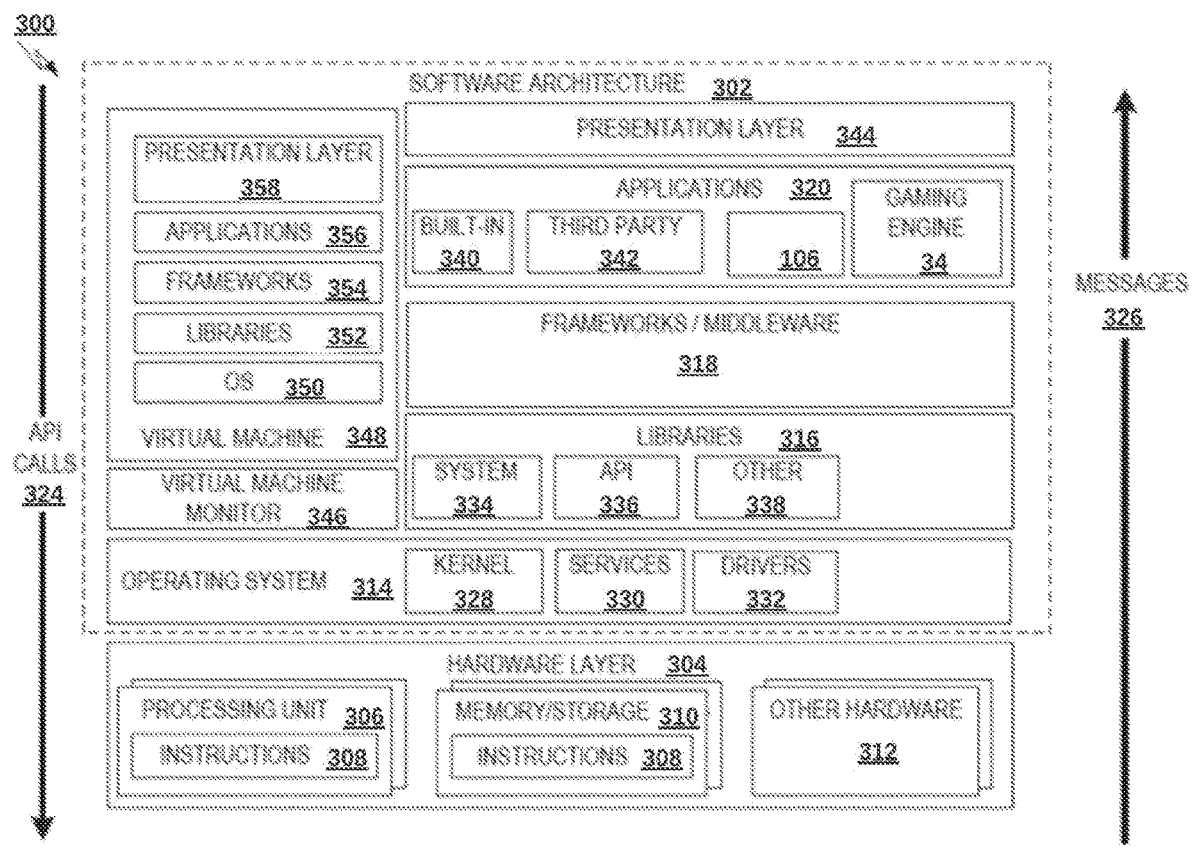
FIG. 3 is a block diagram illustrating an example software architecture, which may be used in conjunction with various hardware architectures described herein.

FIG. 3 is a block diagram 300 illustrating an example software architecture 302, which may be used in conjunction with various hardware architectures herein described to provide a gaming engine 301 and/or components of the XR user interface design system 100. FIG. 3 is a non-limiting example of a software architecture and it will be appreciated that many other architectures may be implemented to facilitate the functionality described herein. The software architecture 302 may execute on hardware such as a machine 400 of FIG. 4 that includes, among other things, processors 410, memory 430, and input/output (I/O) components 450. A representative hardware layer 304 is illustrated and can represent, for example, the machine 400 of FIG. 4. The representative hardware layer 304 includes a processing unit 306 having associated executable instructions 308. The executable instructions 308 represent the executable instructions of the software architecture 302, including implementation of the methods, modules and so forth described herein. The hardware layer 304 also includes memory/storage 310, which also includes the executable instructions 308. The hardware layer 304 may also comprise other hardware 312.

In the example architecture of FIG. 3, the software architecture 302 may be conceptualized as a stack of layers where each layer provides particular functionality. For example, the software architecture 302 may include layers such as an operating system 314, libraries 316, frameworks or middleware 318, applications 320 and a presentation layer 344. Operationally, the applications 320 and/or other components within the layers may invoke application programming interface (API) calls 324 through the software stack and receive a response as messages 326. The layers illustrated are representative in nature and not all software architectures have all layers. For example, some mobile or special purpose operating systems may not provide the frameworks/middleware 318, while others may provide such a layer. Other software architectures may include additional or different layers.

The operating system 314 may manage hardware resources and provide common services. The operating system 314 may include, for example, a kernel 328, services 330, and drivers 332. The kernel 328 may act as an abstraction layer between the hardware and the other software layers. For example, the kernel 328 may be responsible for memory management, processor management (e.g., scheduling), component management, networking, security settings, and so on. The services 330 may provide other common services for the other software layers. The drivers 332 may be responsible for controlling or interfacing with the underlying hardware. For instance, the drivers 332 may include display drivers, camera drivers, Bluetooth® drivers, flash memory drivers, serial communication drivers (e.g., Universal Serial Bus (USB) drivers), Wi-Fi® drivers, audio drivers, power management drivers, and so forth depending on the hardware configuration.

The libraries 316 may provide a common infrastructure that may be used by the applications 320 and/or other components and/or layers. The libraries 316 typically provide functionality that allows other software modules to perform tasks in an easier fashion than to interface directly with the underlying operating system 314 functionality (e.g., kernel 328, services 330 and/or drivers 332). The libraries 416 may include system libraries 334 (e.g., C standard library) that may provide functions such as memory allocation functions, string manipulation functions, mathematic functions, and the like. In addition, the libraries 316 may include API libraries 336 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 3D graphic content on a display), database libraries (e.g., SQLite that may provide various relational database functions), web libraries (e.g., WebKit that may provide web browsing functionality), and the like. The libraries 316 may also include a wide variety of other libraries 338 to provide many other APIs to the applications 320 and other software components/modules.

The frameworks 318 (also sometimes referred to as middleware) provide a higher-level common infrastructure that may be used by the applications 320 and/or other software components/modules. For example, the frameworks/middleware 318 may provide various graphic user interface (GUI) functions, high-level resource management, high-level location services, and so forth. The frameworks/middleware 318 may provide a broad spectrum of other APIs that may be utilized by the applications 320 and/or other software components/modules, some of which may be specific to a particular operating system or platform.

The applications 320 include built-in applications 340 and/or third-party applications 342. Examples of representative built-in applications 340 may include, but are not limited to, a contacts application, a browser application, a book reader application, a location application, a media application, a messaging application, and/or a game application. Third-party applications 342 may include any an application developed using the Android™ or iOS™ software development kit (SDK) by an entity other than the vendor of the particular platform, and may be mobile software running on a mobile operating system such as iOS™, Android™, Windows® Phone, or other mobile operating systems. The third-party applications 342 may invoke the API calls 324 provided by the mobile operating system such as operating system 314 to facilitate functionality described herein.

The applications 320 may use built-in operating system functions (e.g., kernel 328, services 330 and/or drivers 332), libraries 316, or frameworks/middleware 318 to create user interfaces to interact with users of the system. Alternatively, or additionally, in some systems, interactions with a user may occur through a presentation layer, such as the presentation layer 344. In these systems, the application/module "logic" can be separated from the aspects of the application/module that interact with a user.

Some software architectures use virtual machines. In the example of FIG. 3, this is illustrated by a virtual machine 348. The virtual machine 348 creates a software environment where applications/modules can execute as if they were executing on a hardware machine (such as the machine 400 of FIG. 4, for example). The virtual machine 348 is hosted by a host operating system (e.g., operating system 314) and typically, although not always, has a virtual machine monitor 346, which manages the operation of the virtual machine 348 as well as the interface with the host operating system (i.e., operating system 314). A software architecture executes within the virtual machine 348 such as an operating system (OS) 350, libraries 352, frameworks 354, applications 356, and/or a presentation layer 358. These layers of software architecture executing within the virtual machine 348 can be the same as corresponding layers previously described or may be different.

Figure 4:
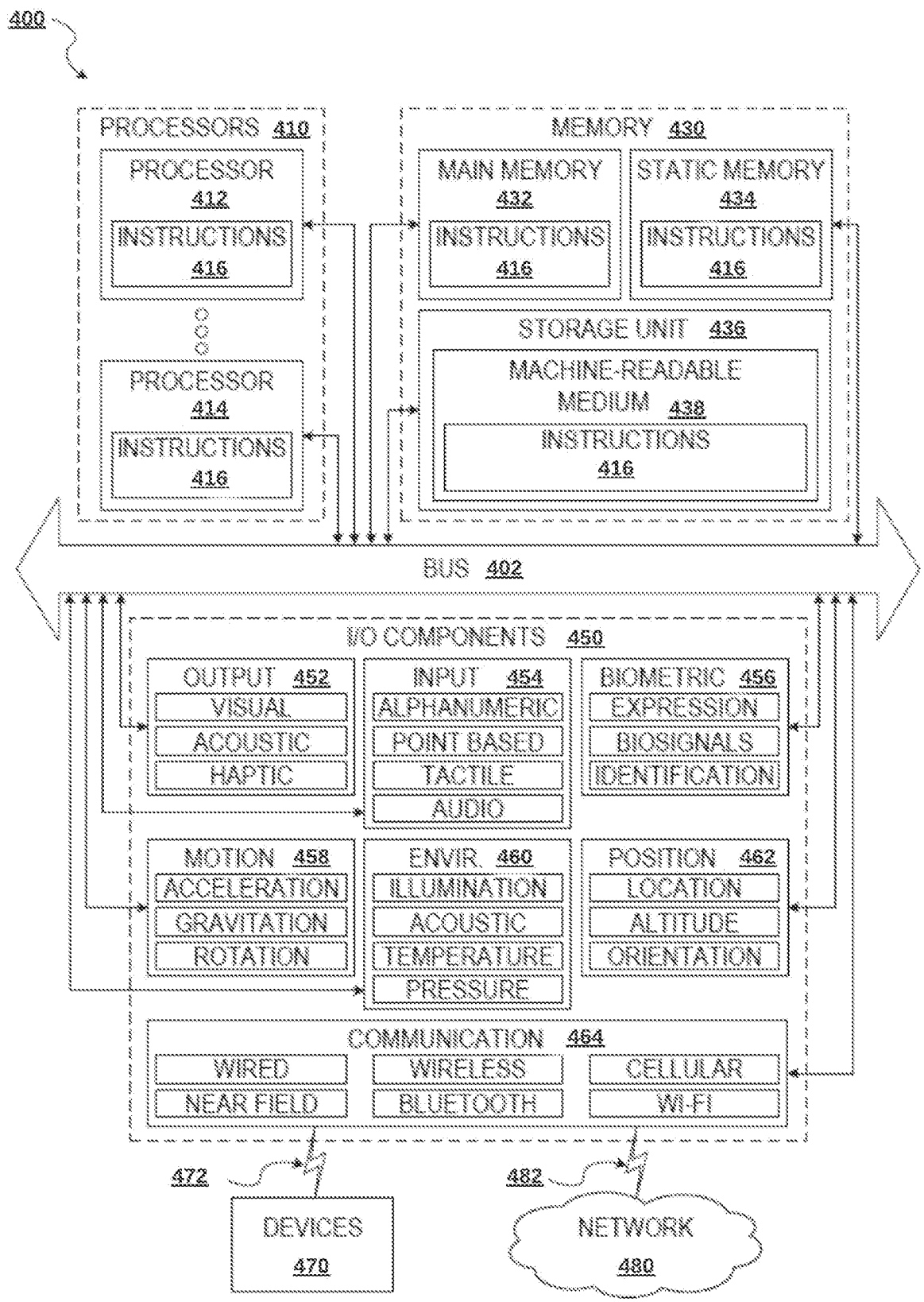
FIG. 4 is a block diagram illustrating components of a machine, according to some example embodiments, configured to read instructions from a. machine-readable medium (e.g., a machine-readable storage medium) and perform any one or more of the methodologies discussed herein.

FIG. 4 is a block diagram illustrating components of a machine 400, according to some example embodiments, configured to read instructions from a machine-readable medium (e.g., a machine-readable storage medium) and perform any one or more of the methodologies discussed herein. In some embodiments, the machine 800 is similar to the user device 104 or the XR device 130. Specifically, FIG. 4 shows a diagrammatic representation of the machine 400 in the example form of a computer system, within which instructions 416 (e.g., software, a program, an application, an applet, an app, or other executable code) for causing the machine 400 to perform any one or more of the methodologies discussed herein may be executed. As such, the instructions 416 may be used to implement modules or components described herein. The instructions transform the general, non-programmed machine into a particular machine programmed to carry out the described and illustrated functions in the manner described. In alternative embodiments, the machine 400 operates as a standalone device or may be coupled (e.g., networked) to other machines. In a networked deployment, the machine 400 may operate in the capacity of a server machine or a client machine in a server-client network environment, or as a peer machine in a peer-to-peer (or distributed) network environment. The machine 400 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 416, sequentially or otherwise, that specify actions to be taken by the machine 400. Further, while only a single machine 400 is illustrated, the term "machine" shall also be taken to include a collection of machines that individually or jointly execute the instructions 416 to perform any one or more of the methodologies discussed herein.

The machine 400 may include processors 410, memory 430, and input/output (I/O) components 450, which may be configured to communicate with each other such as via a bus 402. In an example embodiment, the processors 410 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 412 and a processor 414 that may execute the instructions 416. The term "processor" is intended to include multi-core processor that may comprise two or more independent processors (sometimes referred to as "cores") that may execute instructions contemporaneously. Although FIG. 4 shows multiple processors, the machine 400 may include a single processor with a single core, a single processor with multiple cores (e.g., a multi-core processor), multiple processors with a single core, multiple processors with multiples cores, or any combination thereof.

The memory/storage 430 may include a memory, such as a main memory 432, a static memory 434, or other memory, and a storage unit 436, both accessible to the processors 410 such as via the bus 402. The storage unit 436 and memory 432, 434 store the instructions 416 embodying any one or more of the methodologies or functions described herein. The instructions 416 may also reside, completely or partially, within the memory 432, 434, within the storage unit 436, within at least one of the processors 410 (e.g., within the processor's cache memory), or any suitable combination thereof, during execution thereof by the machine 400. Accordingly, the memory 432, 434, the storage unit 436, and the memory of processors 410 are examples of machine-readable media 438.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "machine-readable medium" should be taken to include a single medium or multiple media (e.g., a centralized or distributed database, or associated caches and servers) able to store the instructions 416. The term "machine-readable medium" shall also be taken to include any medium, or combination of multiple media, that is capable of storing instructions (e.g., instructions 416) for execution by a machine (e.g., machine 400), such that the instructions, when executed by one or more processors of the machine 400 (e.g., processors 410), cause the machine 400 to perform any one or more of the methodologies or operations, including non-routine or unconventional methodologies or operations, or non-routine or unconventional combinations of methodologies or operations, described herein. Accordingly, a "machine-readable medium" refers to a single storage apparatus or device, as well as "cloud-based" storage systems or storage networks that include multiple storage apparatus or devices. The term "machine-readable medium" excludes signals per se.

The input/output (I/O) components 450 may include a wide variety of components to receive input, provide output, produce output, transmit information, exchange information, capture measurements, and so on. The specific input/output (I/O) components 450 that are included in a particular machine will depend on the type of machine. For example, portable machines such as mobile phones will likely include a touch input device or other such input mechanisms, while a headless server machine will likely not include such a touch input device. It will be appreciated that the input/output (I/O) components 450 may include many other components that are not shown in FIG. 4. The input/output (I/O) components 450 are grouped according to functionality merely for simplifying the following discussion and the grouping is in no way limiting. In various example embodiments, the input/output (I/O) components 450 may include output components 452 and input components 454. The output components 452 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 454 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the input/output (I/O) components 450 may include biometric components 456, motion components 458, environmental components 460, or position components 462, among a wide array of other components. For example, the biometric components 456 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 458 may include acceleration sensor components (e.g., accelerometer), gravitation sensor components, rotation sensor components (e.g., gyroscope), and so forth. The environmental components 460 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 462 may include location sensor components (e.g., a Global Position System (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The input/output (I/O) components 450 may include communication components 464 operable to couple the machine 400 to a network 480 or devices 470 via a coupling 482 and a coupling 472 respectively. For example, the communication components 464 may include a network interface component or other suitable device to interface with the network 480. In further examples, the communication components 464 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 470 may be another machine or any of a wide variety of peripheral devices (e.g., a peripheral device coupled via a Universal Serial Bus (USB)).

Moreover, the communication components 464 may detect identifiers or include components operable to detect identifiers. For example, the communication components 464 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 462, such as, location via Internet Protocol (IP) geo-location, location via Wi-Fi® signal triangulation, location via detecting a NFC beacon signal that may indicate a particular location, and so forth.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within the scope of embodiments of the present disclosure as represented by the appended claims. The specification and drawings are, accordingly, to be regarded in an illustrative rather than a restrictive sense.

What is claimed is:
1. A system comprising:
one or more computer processors;
one or more computer memories;
a set of instructions incorporated into the one or more computer memories, the set of instructions configuring the one or more computer processors to perform operations, the operations comprising:
importing a two-dimensional data set, the two-dimensional data set defining a two-dimensional user interface design layout, the two-dimensional data set including a transition data set corresponding to a user interface element included in the design layout;
converting the two-dimensional data set into a three-dimensional data set, the three-dimensional data set defining a three-dimensional user interface design layout corresponding to the two-dimensional design layout, the converting including identifying three-dimensional art for each of a plurality of phases corresponding to the transition data set; and providing an XR representation of the three-dimensional data set for editing using an editing application associated with one or more XR devices; and based on the editing, exporting the three-dimensional data set as one or more files that are compatible with an XR development environment.

2. The system of claim 1, wherein the editing application associated with the one or more XR devices is a lightweight editing application that uses less of at least one computing resource than the XR development environment.

3. The system of claim 2, wherein the computing resource is one of processing power, memory, or network bandwidth.

4. The system of claim 1, wherein the two-dimensional data set is exported from a two-dimensional user interface design tool using a plug-in for generating the two-dimensional data in a format that is compatible with the editing application.

5. The system of claim 1, further comprising converting the three-dimensional data set into an additional two-dimensional data set, the additional two-dimensional data set being importable into the two-dimensional design tool using the plug-in or an additional plug-in.

6. The system of claim 1, wherein the two-dimensional data set includes an additional transition data set corresponding to an additional user interface element included in the design layout and the converting further includes identifying three-dimensional art for each of a plurality of phases corresponding to the additional transition data set.

7. The system of claim 1, wherein providing of the XR representation of the three-dimensional data set includes rendering the three-dimensional art according to the plurality of the phases.

8. A method comprising:
performing operations for generating an XR user interface, the operations comprising:
importing a two-dimensional data set, the two-dimensional data set defining a two-dimensional user interface design layout, the two-dimensional data set including a transition data set corresponding to a user interface element included in the design layout;
converting the two-dimensional data set into a three-dimensional data set, the three-dimensional data set defining a three-dimensional user interface design layout corresponding to the two-dimensional design layout, the converting including identifying three-dimensional art for each of a plurality of phases corresponding to the transition data set; and
providing an XR representation of the three-dimensional data set for editing using an editing application associated with one or more XR devices; and
based on the editing, exporting the three-dimensional data set as one or more files that are compatible with an XR development environment.

9. The method of claim 8, wherein the editing application associated with the one or more XR devices is a lightweight editing application that uses less of at least one computing resource than the XR development environment.

10. The method of claim 9, wherein the computing resource is one of processing power, memory, or network bandwidth.

11. The method of claim 8, wherein the two-dimensional data set is exported from a two-dimensional user interface design tool using a plug-in for generating the two-dimensional data in a format that is compatible with the editing application.

12. The method of claim 8, further comprising converting the three-dimensional data set into an additional two-dimensional data set, the additional two-dimensional data set being importable into the two-dimensional design tool using the plug-in or an additional plug-in.

13. The method of claim 8, wherein the two-dimensional data set includes an additional transition data set corresponding to an additional user interface element included in the design layout and the converting further includes identifying three-dimensional art for each of a plurality of phases corresponding to the additional transition data set.

14. The method of claim 8, wherein providing of the XR representation of the three-dimensional data set includes rendering the three-dimensional art according to the plurality of the phases.

15. A non-transitory computer-readable storage medium including a set of instructions that, when executed by one or more computer processors, cause the one or more computer processors to perform operations comprising:
performing operations for generating an XR user interface, the operations comprising:
importing a two-dimensional data set, the two-dimensional data set defining a two-dimensional user interface design layout, the two-dimensional data set including a transition data set corresponding to a user interface element included in the design layout;
converting the two-dimensional data set into a three-dimensional data set, the three-dimensional data set defining a three-dimensional user interface design layout corresponding to the two-dimensional design layout, the converting including identifying three-dimensional art for each of a plurality of phases corresponding to the transition data set; and
providing an XR representation of the three-dimensional data set for editing using an editing application associated with one or more XR devices; and
based on the editing, exporting the three-dimensional data set as one or more files that are compatible with an XR development environment.

16. The non-transitory computer-readable storage medium of claim 15, wherein the editing application associated with the one or more XR devices is a lightweight editing application that uses less of at least one computing resource than the XR development environment.

17. The non-transitory computer-readable storage medium of claim 16, wherein the computing resource is one of processing power, memory, or network bandwidth.

18. The non-transitory computer-readable storage medium of claim 15, wherein the two-dimensional data set is exported from a two-dimensional user interface design tool using a plug-in for generating the two-dimensional data in a format that is compatible with the editing application.

19. The non-transitory computer-readable storage medium of claim 15, further comprising converting the three-dimensional data set into an additional two-dimensional data set, the additional two-dimensional data set being importable into the two-dimensional design tool using the plug-in or an additional plug-in.

20. The non-transitory computer-readable storage medium of claim 15, wherein the two-dimensional data set includes an additional transition data set corresponding to an additional user interface element included in the design layout and the converting further includes identifying three-dimensional art for each of a plurality of phases corresponding to the additional transition data set.

\* \* \* \* \*